US012751144B2

(12) United States Patent
Wang

(10) Patent No.: US 12,751,144 B2
(45) Date of Patent: Sep. 29, 2026

(54) PIXEL DEFINITION LAYER ON DISPLAY SUBSTRATE, DISPLAY SUBSTRATE, AND DISPLAY APPARATUS

(71) Applicants: Hefei BOE Joint Technology Co., Ltd., Hefei (CN); BOE Technology Group Co., Ltd., Beijing (CN)

(72) Inventor: Huifeng Wang, Beijing (CN)

(73) Assignees: Hefei Boe Joint Technology Co., ltd., Anhui (CN); BOE Technology Group Co., Ltd., Beijing (CN)

( * ) Notice: Subject to any disclaimer, the term of this patent is extended or adjusted under 35 U.S.C. 154(b) by 668 days.

(21) Appl. No.: 18/022,998

(22) PCT Filed: Apr. 25, 2022

(86) PCT No.: PCT/CN2022/089055

§ 371 (c)(1),
(2) Date: Feb. 24, 2023

(87) PCT Pub. No.: WO2023/206015

PCT Pub. Date: Nov. 2, 2023

(65) Prior Publication Data

US 2024/0292663 A1 Aug. 29, 2024

(51) Int. Cl.
*H10K 59/122* (2023.01)
*H10K 59/121* (2023.01)
(Continued)

(52) U.S. Cl.
CPC ....... *H10K 59/122* (2023.02); *H10K 59/1213* (2023.02); *H10K 59/80515* (2023.02); *H10K 59/874* (2023.02); *H10K 2102/351* (2023.02)

(58) Field of Classification Search
CPC ............... H10K 59/122; H10K 59/874; H10K 59/80515; H10K 59/1213; H10K 50/81;
(Continued)

(56) References Cited

U.S. PATENT DOCUMENTS 5,182,620 A 1/1993 Shimada et al.
11,056,544 B1 * 7/2021 Wei ..................... H10K 59/353
(Continued)

FOREIGN PATENT DOCUMENTS

CN 106206604 A 12/2016
CN 106531770 A 3/2017
(Continued)

OTHER PUBLICATIONS

First CN Office Action Application No. or Publication No. 202280000882.4 issued Jun. 22, 2026.

*Primary Examiner* — Alonzo Chambliss

(57) ABSTRACT

A display substrate and a display apparatus. The display substrate includes: a base and a pixel definition layer arranged on a side of the base, the pixel definition layer includes: a first definition layer and a second definition layer located on a side of the first definition layer away from the base, the first definition layer includes: a plurality of first definition structures arranged in an array, the second definition layer includes: a plurality of second definition structures arranged at intervals in a first direction, wherein a plurality of first definition structures located between two adjacent second definition structures are arranged at intervals in a second direction, and an orthographic projection of a first definition structure on the base is separated from an orthographic projection of a second definition structure on the base, the second direction intersects the first direction.

16 Claims, 6 Drawing Sheets

(51) Int. Cl.
*H10K 59/80* (2023.01)
*H10K 102/00* (2023.01)

(58) Field of Classification Search
CPC ............. H10K 59/40; H10K 59/80521; H10K 2102/351
See application file for complete search history.

(56) References Cited

U.S. PATENT DOCUMENTS

| | | | | |
|---|---|---|---|---|
| 2019/0088726 | A1 | 3/2019 | Zhang | |
| 2019/0305059 | A1* | 10/2019 | Hou | H10K 59/352 |
| 2023/0247866 | A1* | 8/2023 | Zhao | H10K 59/1201 257/40 |

FOREIGN PATENT DOCUMENTS

| | | | | |
|---|---|---|---|---|
| CN | 107731871 | A | 2/2018 | |
| CN | 111293152 | A | 6/2020 | |
| CN | 215578569 | U | 1/2022 | |
| CN | 215644558 | U | 1/2022 | |
| CN | 112349749 | B | 8/2022 | |
| CN | 117479652 | A * | 1/2024 | |
| WO | WO-2010070800 | A1 * | 6/2010 | H10K 59/173 |
| WO | WO-2023225953 | A1 * | 11/2023 | H10K 71/00 |

* cited by examiner

PIXEL DEFINITION LAYER ON DISPLAY SUBSTRATE, DISPLAY SUBSTRATE, AND DISPLAY APPARATUS

CROSS-REFERENCE TO RELATED APPLICATION

The present application is a U.S. National Phase Entry of International Application No. PCT/CN2022/089055 having an international filing date of Apr. 25, 2022, the content of which is incorporated into this application by reference.

TECHNICAL FIELD

Embodiments of the present disclosure relate to, but are not limited to, the field of display technologies, and particularly to a display substrate and a display apparatus.

BACKGROUND

An Organic Light Emitting Diode (OLED) is an active light emitting display device, which has advantages such as self-luminescence, wide viewing angle, high contrast, low power consumption, extremely high response speed, lightness and thinness, flexibility, and low cost. With the continuous development of display technologies, a display apparatus using an OLED as a light emitting device and a Thin Film Transistor (TFT) for signal control has become a mainstream product in the field of display at present.

At present, in order to improve the thickness uniformity of functional layers in an OLED light emitting device, a Pixel Definition Layer (PDL) in an OLED display apparatus generally adopts a double-layer structure formed by two layers of materials with different wettability. However, a problem of overlay will easily occur in the pixel definition layer formed by the double-layer structure, which leads to a reduction in the quality of the pixel definition layer and easily incurs a risk of ink overflow, thereby affecting the display effect of the display apparatus.

SUMMARY

The following is a summary of subject matters described herein in detail. The summary is not intended to limit the protection scope of claims.

In one aspect, an embodiment of the present disclosure provides a display substrate, including: a base and a pixel definition layer arranged on a side of the base, the pixel definition layer includes: a first definition layer and a second definition layer located on a side of the first definition layer away from the base, the first definition layer includes: a plurality of first definition structures arranged in an array, the second definition layer includes: a plurality of second definition structures arranged at intervals in a first direction, wherein a plurality of first definition structures located between two adjacent second definition structures are arranged at intervals in a second direction, and an orthographic projection of a first definition structure on the base is separated from an orthographic projection of a second definition structure on the base, the second direction intersects the first direction.

In an exemplary embodiment, the display substrate further includes: a drive circuit layer arranged on a side of the base close to the pixel definition layer, and an anode layer arranged on a side of the drive circuit layer close to the pixel definition layer, the drive circuit layer includes: a plurality of drive transistors, the anode layer includes: a plurality of anodes arranged in an array, an anode includes: a first portion configured to be connected, in a lapped way, with a drain electrode of a corresponding drive transistor through a via hole, a width of the first portion is smaller than a width of the first definition structure, the width refers to a dimensional feature in the first direction.

In an exemplary embodiment, the display substrate further includes: an organic light emitting layer and a plurality of pixel opening areas, the plurality of pixel opening areas are defined by the plurality of first definition structures and the plurality of second definition structures, at least a portion of the organic light emitting layer is located in a pixel opening area, the anode further includes: a second portion located on a side of the first portion in a direction opposite the second direction, wherein the second portion is configured to be connected with the organic light emitting layer, a width of the second portion is greater than the width of the first portion, and there is an overlapping area between an orthographic projection of the second portion on the base and an orthographic projection of the second definition structure on the base.

In an exemplary embodiment, the anode further includes: a third portion located on a side of the second portion in a direction opposite the second direction, wherein a width of the third portion is smaller than the width of the second portion, and the width of the third portion is smaller than or equal to the width of the first definition structure.

In an exemplary embodiment, in a plane parallel to the display substrate, the anode has a center line extending in the second direction, and at least one of shapes of the first portion, the second portion and the third portion is a pattern symmetric about the center line.

In an exemplary embodiment, in a plane parallel to the display substrate, a sectional shape of each of the first portion, the second portion and the third portion is a rectangle.

In an exemplary embodiment, in two anodes adjacent in the second direction, a boundary of an orthographic projection of a first portion of one anode on the base and a boundary of an orthographic projection of a third portion of the other anode on the base are within a boundary range of an orthographic projection of a same first definition structure on the base.

In an exemplary embodiment, the second definition structure includes: a first area corresponding to the first portion, a second area corresponding to the second portion, and a third area corresponding to the third portion, a width of the first area and a width of the third area are both smaller than or equal to a width of the second area.

In an exemplary embodiment, a spacing between second areas of two adjacent second definition structures is smaller than the width of the second portion.

In an exemplary embodiment, in a plane parallel to the display substrate, a shape of the anode is a notched rectangle.

In an exemplary embodiment, a material of the first definition structure is a lyophilic material, and a material of the second definition structure is a lyophobic material.

In an exemplary embodiment, a thickness of the first definition structure is 0.1 microns to 1 micron, and a thickness of the second definition structure is 1 micron to 10 microns.

In an exemplary embodiment, in a plane parallel to the display substrate, a sectional shape of the second definition structure is an elongated rectangle, or in a plane perpendicular to the base, a sectional shape of the second definition structure is a trapezoid.

In an exemplary embodiment, in a plane parallel to the display substrate, a sectional shape of the first definition structure is any one of a rectangle, a rectangle with a chamfered corner, and a notched rectangle.

In another aspect, an embodiment of the present disclosure further provides a display apparatus, including: the display substrate in one or more of the aforementioned embodiments.

Other features and advantages of the present disclosure will be set forth in the following specification, and partially become apparent from the specification or are understood by implementing the present disclosure. Other advantages of the present disclosure may be achieved and obtained through solutions described in the specification and drawings.

Other aspects may be understood upon reading and understanding the drawings and detailed description.

BRIEF DESCRIPTION OF DRAWINGS

The drawings are used for providing understanding of technical solutions of the present disclosure, constitute a part of the specification, and together with the embodiments of the present disclosure, are used for explaining the technical solutions of the present disclosure, but do not form limitations on the technical solutions of the present disclosure. Shape and size of each component in the drawings do not reflect actual scales, and are only intended to schematically illustrate contents of the present disclosure.

DETAILED DESCRIPTION

Figure 1A:
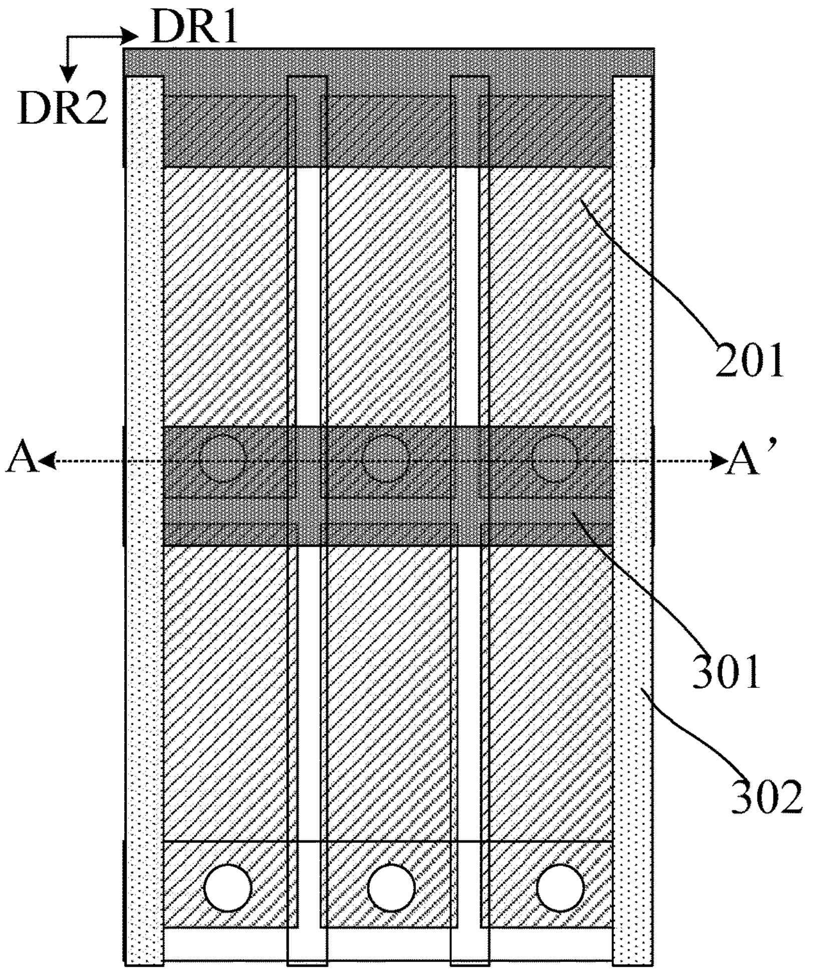
FIG. 1A is a schematic diagram of a planar structure of a display substrate.

To make objectives, technical solutions, and advantages of the present disclosure clearer, the embodiments of the present disclosure will be described in detail with reference to the accompanying drawings. It is to be noted that implementations may be carried out in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other without conflict. In order to keep following description of the embodiments of the present disclosure clear and concise, detailed descriptions about part of known functions and known components are omitted in the present disclosure. The drawings of the embodiments of the present disclosure only involve structures involved in the embodiments of the present disclosure, and for other structures, reference may be made to usual designs.

Scales of the drawings in the present disclosure may be used as a reference in the actual process, without being limited thereto. For example, a width-length ratio of a channel, a thickness and spacing of each film layer, etc. may be adjusted according to actual needs. For example, in the drawings, a size of each constituent element, a thickness of a layer, or an area is exaggerated sometimes for clarity. Therefore, an implementation of the present disclosure is not necessarily limited to the dimension, and a shape and size of each component in the drawings do not reflect true proportions. In addition, the drawings schematically illustrate ideal examples, and one implementation of the present disclosure is not limited to the shapes, numerical values, or the like shown in the drawings.

The "first", "second", "third" and other ordinal numbers in the exemplary embodiments of the present disclosure are set to avoid confusion of constituent elements, not set to provide any quantitative limitation.

In the exemplary embodiments of the present disclosure, for the sake of convenience, wordings such as "central", "upper", "lower", "front", "rear", "vertical", "horizontal", "top", "bottom", "inner", "outer" and the others describing the orientations or positional relationships are used to depict the positional relationship of constituent elements with reference to the drawings, which are only for an easy and simplified description of the present disclosure, rather than for indicating or implying that the device or element referred must have a specific orientation, or must be constructed and operated in a particular orientation and therefore, those wordings cannot be construed as limitations on the present disclosure. The positional relationships between the constituent elements are changed as appropriate according to a direction for describing each constituent element. Therefore, appropriate replacements may be made according to situations without being limited to the wordings described in the specification.

In the exemplary embodiments of the present disclosure, the terms "install", "connect" and "couple" shall be broadly understood unless otherwise explicitly specified and defined. For example, a connection may be a fixed connection, or a detachable connection, or an integrated connection. It may be a mechanical connection or an electrical connection. It may be a direct mutual connection, or an indirect connection through middleware, or internal communication between two elements. Those of ordinary skills in the art may understand meanings of the above-mentioned terms in the present disclosure according to situations.

In the exemplary embodiments of the present disclosure, "an electrical connection" includes a case where constituent elements are connected via an element having a certain electrical action. The "element having a certain electrical action" is not particularly limited as long as electrical signals may be sent and received between the connected constituent elements. For example, the "element having a certain electrical action" may be an electrode or wiring, or a switch element (such as a transistor), or other functional elements, such as a resistor, an inductor, a capacitor, or the like.

In an exemplary embodiment of the present disclosure, a transistor refers to an element that at least includes three terminals, i.e., a gate electrode (gate or control electrode), a drain electrode (drain electrode terminal, drain area, or drain), and a source electrode (source electrode terminal, source area, or source). A transistor has a channel region between a drain electrode and a source electrode, and a current can flow through the drain electrode, the channel region, and the source electrode. It is to be noted that, in the specification, the channel region refers to a region through which the current mainly flows.

In an exemplary embodiment of the present disclosure, in order to distinguish two electrodes of a transistor other than a gate electrode (gate or control electrode), one of the two electrodes is directly described as a first electrode, while the other is described as a second electrode. The first electrode may be a drain electrode, and the second electrode may be a source electrode. Or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

Transistors in the embodiments of the present disclosure may be Thin Film Transistors (TFTs), or Field Effect Transistors (FETs), or other devices with same characteristics. For example, a thin film transistor used in the embodiments of the present disclosure may include, but is not limited to, an oxide TFT or a Low Temperature Poly-silicon TFT (LTPS TFT), etc., which is not limited here in the embodiments of the present disclosure.

In the exemplary embodiments of the present disclosure, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the exemplary embodiments of the present disclosure, "about" refers to that a boundary is defined not so strictly and numerical values within process and measurement error ranges are allowed.

In an exemplary embodiment of the present disclosure, a first direction DR1 may refer to a horizontal direction, a second direction DR2 may refer to a vertical direction, and a third direction DR3 may refer to a thickness direction of a display substrate, or a direction perpendicular to a plane of a display substrate, etc. The first direction DR1 intersects the second direction DR2, and the first direction DR1 intersects the third direction DR3. For example, the first direction DR1 and the second direction DR2 may be perpendicular to each other, and the first direction DR1 and the third direction DR3 may be perpendicular to each other.

Organic light emitting diodes (OLED) have been regarded as a promising next generation display technology due to their advantages of thinness, light weight, wide viewing angle, active light emitting, continuous and adjustable color of emitted light, fast response, low energy consumption, simple production process, high light emitting efficiency and flexible display, and the like, and are widely used in various electronic products.

Film formation approaches of the OLED mainly include a vapor deposition process or a solution process. The vapor deposition process is relatively mature in small-size applications, and at present it has been applied for mass production. However, this technology is expensive in materials and low in material utilization, increasing the cost of product development. The OLED film formation approach of solution process mainly includes inkjet printing, nozzle coating, spin coating, screen printing, etc. Among them, the inkjet printing technology is considered as an important way to achieve mass production of medium-size and large-size OLEDs due to its high material utilization and a capability of large-size implementation.

At present, in order to form an organic light emitting layer in the OLED by the inkjet printing technology, a pixel definition layer (PDL) needs to be manufactured on an electrode of the base in advance to define the printing ink to accurately flow into a designated R/G/B (red/green/blue) pixel opening areas, and the printing ink needs to be fully spread in the pixel opening areas without overflowing.

With the increasing resolution (Pixels Per Inch, PPI) of printed OLED products, correspondingly, the requirements for the landing accuracy of printing ink droplets, the control of intra-pixel film formation and the Mura (non-uniformity) control capability are getting higher and higher in the printing process. With regard to the problem of the relatively short service life of current OLED devices, a high aperture ratio may alleviate display degradation caused by the service life of the devices. Generally, a pixel definition layer adopts a double-layer structure in which one layer is superimposed on the other layer, which can effectively improve the aperture ratio of pixels and uniformity within the pixel, and is widely used in printing medium-size top emission devices.

Figure 1B:
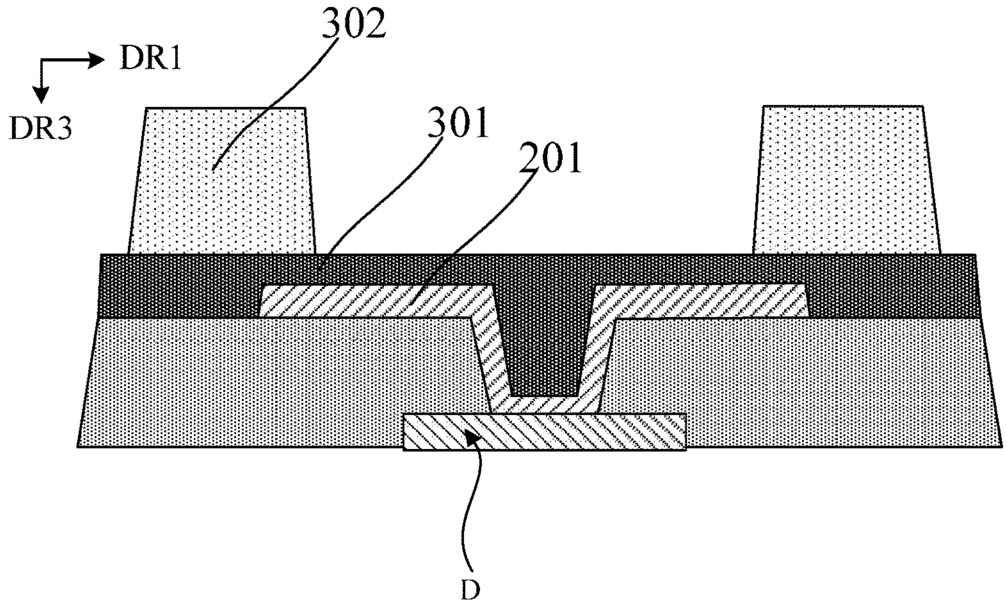
FIG. 1B is a schematic sectional view of the display substrate in FIG. 1A taken in an AA' direction.

FIG. 1A is a schematic diagram of a planar structure of a display substrate, and FIG. 1B is a schematic sectional view of the display substrate in FIG. 1A taken in an AA' direction. As shown in FIG. 1A and FIG. 1B, a pixel definition layer (PDL) may include: a first definition layer PDL1 and a second definition layer PDL2 which are stacked. The first definition layer PDL1 may include: a plurality of strip-shaped first definition structures 301 extending in a first direction DR1, the plurality of first definition structures 301 are sequentially arranged at intervals in a Bank in a second direction DR2. The second definition layer PDL2 may include: a plurality of strip-shaped second definition structures 302 extending in the second direction DR2, the plurality of second definition structures 302 are sequentially arranged at intervals in a Bank in the first direction DR1. The first definition structures 301 and the second definition structures 302 vertically intersect to define a plurality of pixel opening areas.

In the printing process, since the first definition layer PDL1 does not have a lyophobic property, the printing ink will flow normally on the first definition layer PDL1 without agglomeration, thus avoiding non-uniformity film formation of the printing ink during drying, and since the second definition layer PDL2 has a lyophobic property, the ink will agglomerate on the second definition layer PDL2, thus avoiding overflow of the printing ink across the second definition layer PDL2 to a neighboring pixel opening area. However, there is an overlay area between the first definition layer PDL1 and the second definition layer PDL2, a portion of the second definition layer PDL2 located in the overlay area will be lifted by the first definition layer PDL1, so that an absolute height of the portion of the second definition layer PDL2 located in the overlay area (i.e., a portion located above the first definition layer PDL1) is smaller than a height of a portion of the second definition layer PDL2 located in a normal area. As a result, the lyophobic property of the portion of the second definition layer PDL2 located in the overlay area will deteriorate, so that the overlay area between the first definition layer PDL1 and the second definition layer PDL2 tends to be a high risk area for ink overflow in the printing process. As can be seen, the problem of overlay occurs easily in the current pixel definition layer, which leads to a degradation in the quality of the pixel definition layer and a deterioration in the display effect of the display substrate.

An embodiment of the present disclosure provides a display substrate. The display substrate may include: a base and a pixel definition layer arranged on a side of the base. The pixel definition layer may include: a first definition layer PDL1, and a second definition layer PDL2 located on a side of the first definition layer PDL1 away from the base. The first definition layer PDL1 includes: a plurality of first definition structures arranged in an array. The second definition layer PDL2 may include: a plurality of second definition structures arranged at intervals in a first direction DR1. A plurality of first definition structures located between two adjacent second definition structures are arranged at intervals in a second direction, and an orthographic projection of the first definition structure on the base is separated from an orthographic projection of the second definition structure on the base. In this way, overlay between the first definition structure and the second definition structure can be avoided, so that the problem of overlay in the pixel definition layer can be avoided, the risk of reduction in the lyophobic property of the second definition layer PDL2 can be avoided, the quality of the pixel definition layer can be improved, and further, the display effect can be improved.

In an exemplary embodiment, the display substrate may further include: a drive circuit layer arranged on a side of the base close to the pixel definition layer, and an anode layer arranged on a side of the drive circuit layer close to the pixel definition layer. The drive circuit layer may include: a plurality of drive transistors. The anode layer may include: a plurality of anodes arranged in an array. The anode may include: a first portion configured to be connected, in a lapped way, with a drain electrode of a corresponding drive transistor through a via hole, a width of the first portion is smaller than a width of the first definition structure. Here, the width may refer to a dimensional feature in the first direction DR1. As such, in the display substrate provided by an embodiment of the present disclosure, since the first portion of the anode is connected with a drain electrode of a drive transistor M in a lapped way, and the width of the first portion of the anode is smaller than the width of the first definition structure, the first definition structure may completely cover the first portion of the anode and the first definition structure completely covers the via hole, thus avoiding the risk of electric leakage. In this way, for the display substrate provided by an embodiment of the present disclosure, the quality of the pixel definition layer can be improved, the risk of electric leakage can be avoided, and the display effect can be further improved.

In an exemplary embodiment, the display substrate may further include: an organic light emitting layer and a plurality of pixel opening areas. The plurality of pixel opening areas may be defined by the plurality of first definition structures and the plurality of second definition structures, and at least a portion of the organic light emitting layer is located in the pixel opening area. The anode may further include: a second portion located on a side of the first portion in a direction opposite the second direction DR2. The second portion is configured to be connected with the organic light emitting layer, a width of the second portion is greater than a width of the first portion, and there is an overlapping area between an orthographic projection of the second portion on the base and an orthographic projection of the second definition structure on the base. As such, in the display substrate provided by an embodiment of the present disclosure, since the second portion of the anode is connected with the organic light emitting layer, by setting the width of the second portion of the anode to be larger than the width of the first portion of the anode and setting the second definition structure to overlap with the second portion of the anode, the second definition structures on both sides of the anode can be connected with the second portion of the anode in a lapped way, thereby avoiding the risk of electric leakage, and improving the display effect.

In an exemplary embodiment, at least a portion of the organic light emitting layer is located within the pixel opening area and in connection with the second portion of the anode.

In an exemplary embodiment, the anode may further include: a third portion located on a side of the second portion of the anode in a direction opposite the second direction DR2, wherein a width of the third portion of the anode is smaller than the width of the second portion of the anode, and the width of the third portion of the anode is smaller than or equal to the width of the first definition structure. In this way, the anode has a shape of a strip-shaped structure with a wide middle and two narrow sides extending in the second direction, which not only can avoid overlay between the first definition layer PDL1 and the second definition layer PDL2, but also can avoid the risk of electric leakage due to incomplete anode coverage. Therefore, the display effect can be improved.

Figure 2:
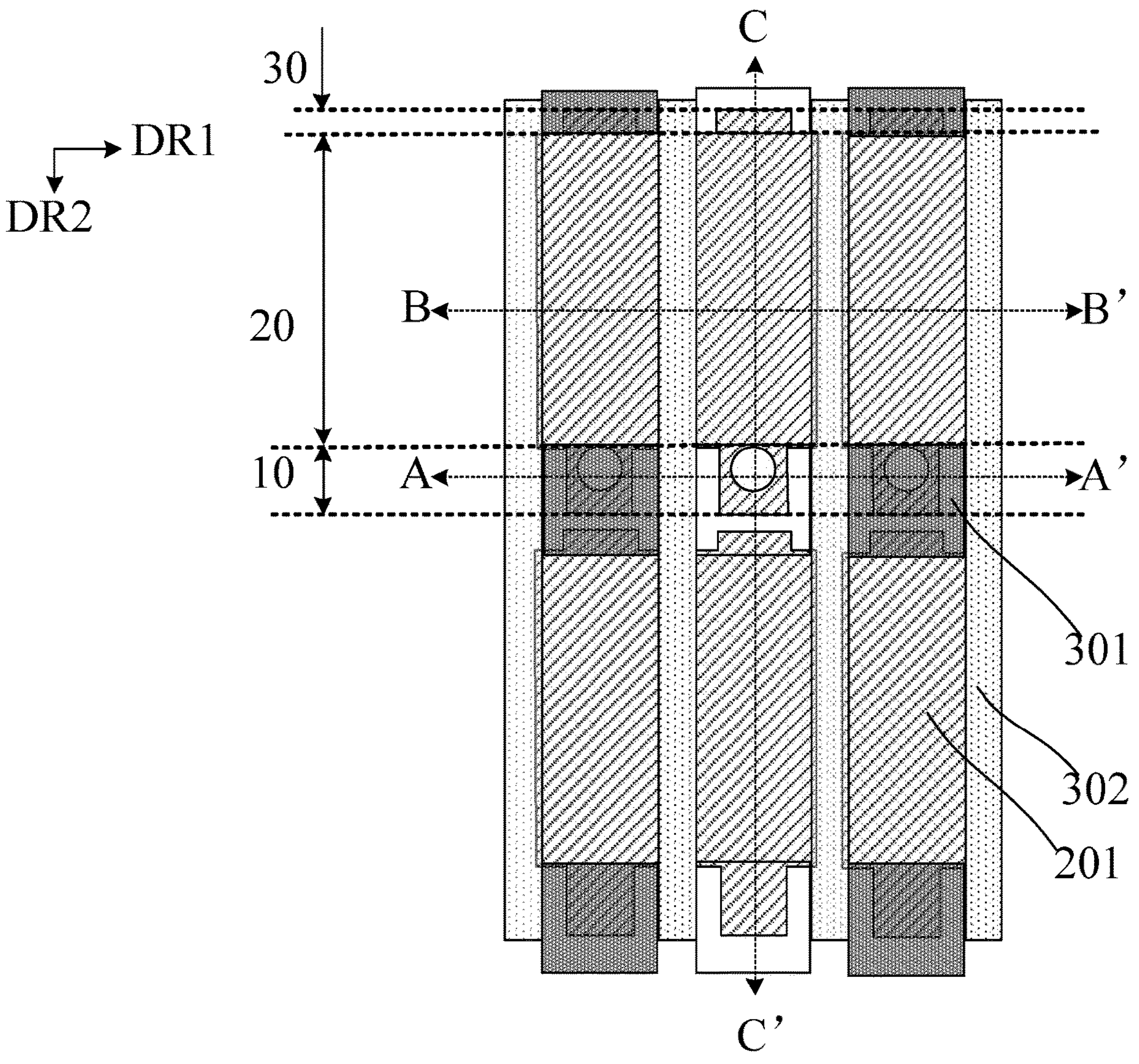
FIG. 2 is a schematic diagram of a first planar structure of a display substrate in an exemplary embodiment of the present disclosure.
Figure 3:
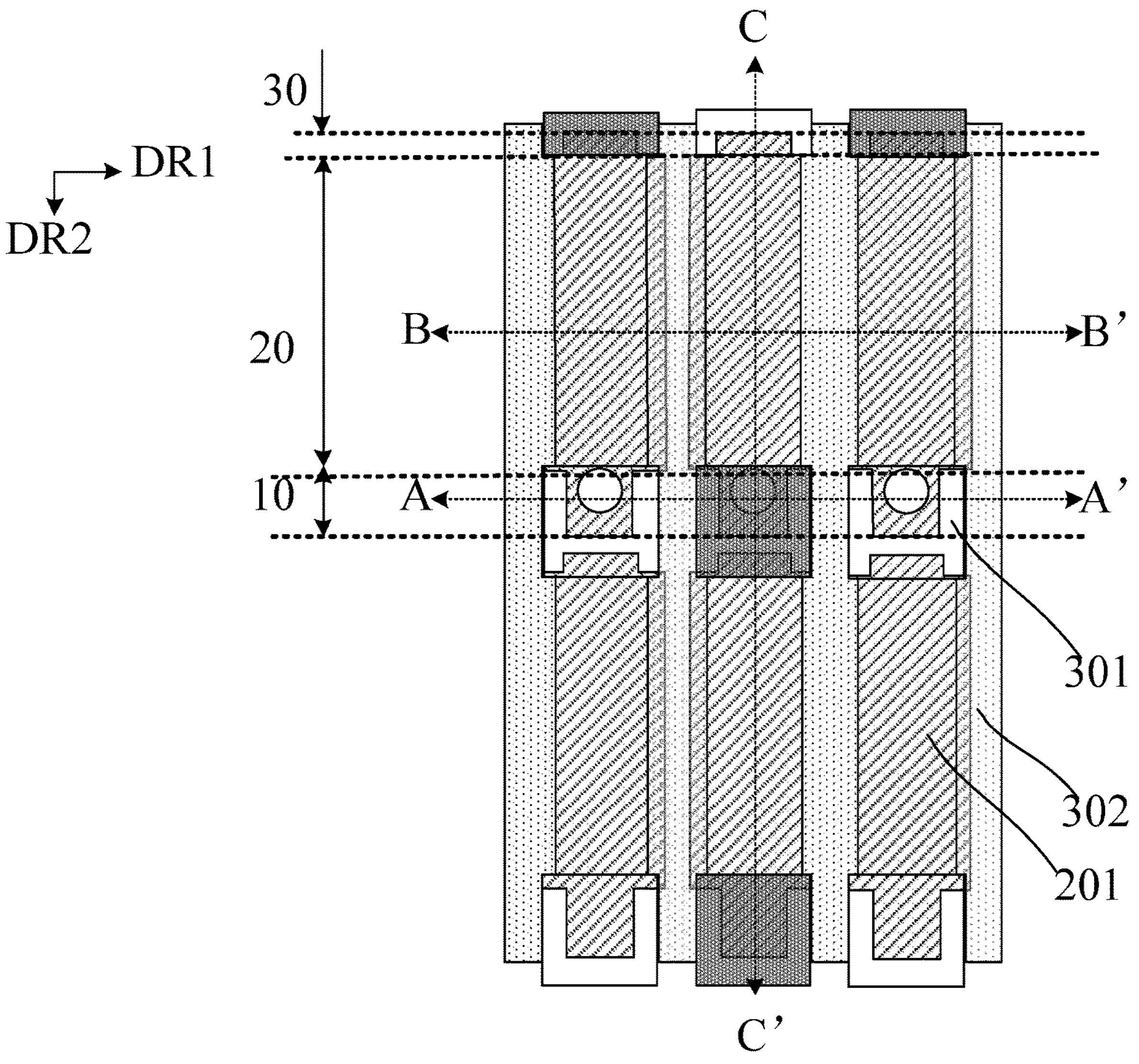
FIG. 3 is a schematic diagram of a second planar structure of a display substrate in an exemplary embodiment of the present disclosure.
Figure 4:
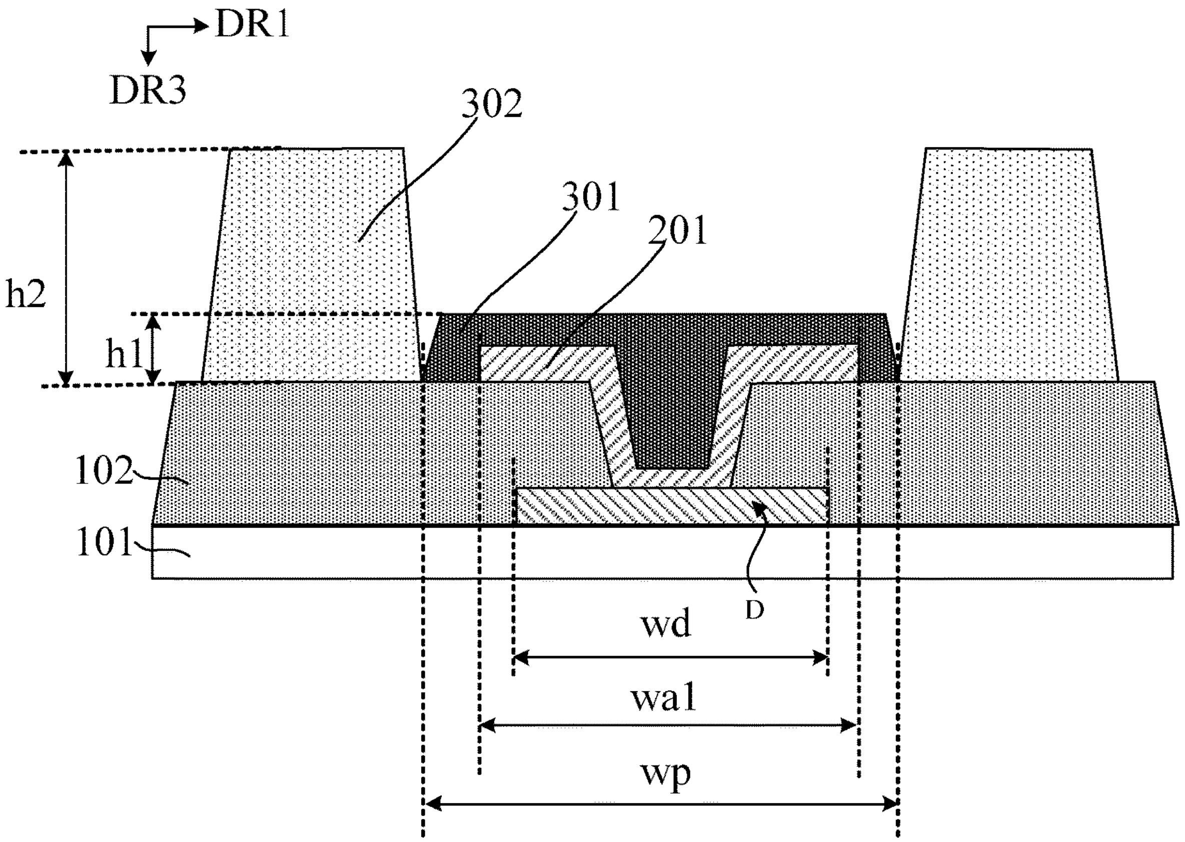
FIG. 4 is a schematic sectional view of the display substrate in FIG. 2 taken in an AA' direction.
Figure 5:
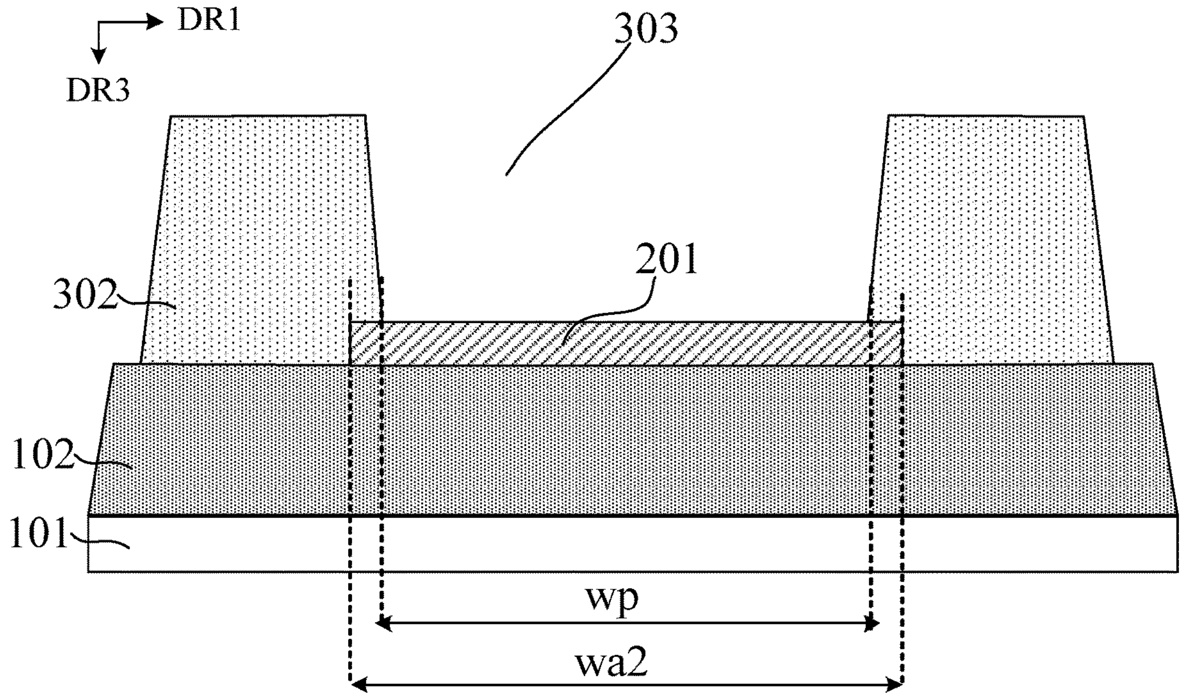
FIG. 5 is a schematic sectional view of the display substrate in FIG. 2 taken in a BB' direction.
Figure 6:
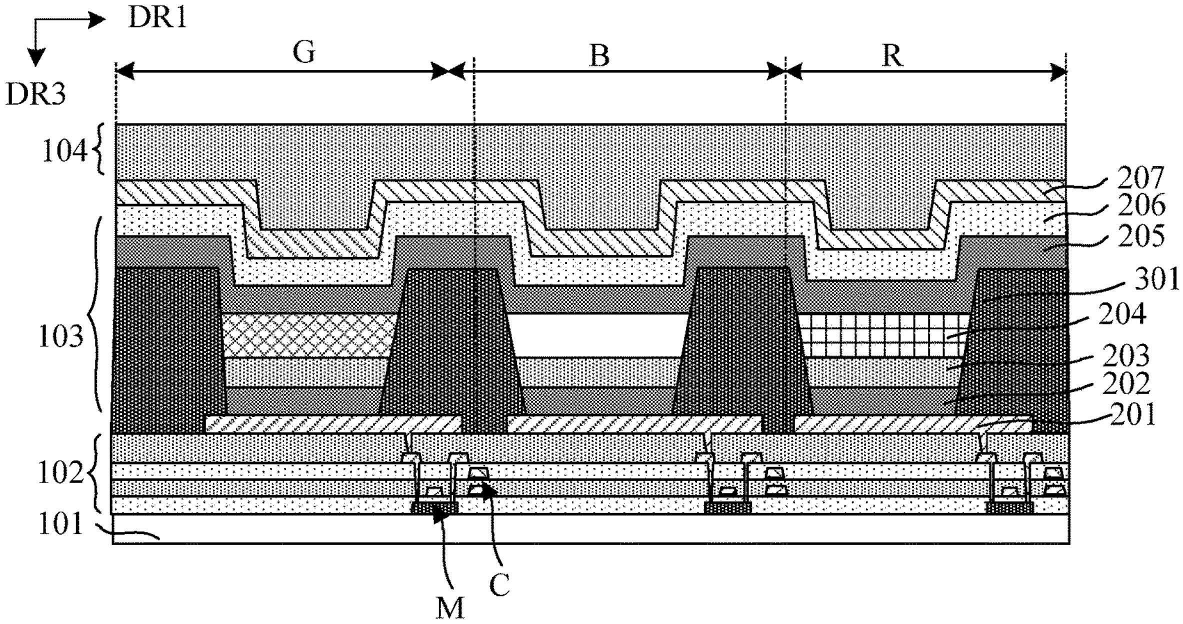
FIG. 6 is a schematic sectional view of the display substrate in FIG. 2 taken in a CC' direction.

FIG. 2 is a schematic diagram of a first planar structure of a display substrate in an exemplary embodiment of the present disclosure, FIG. 3 is a schematic diagram of a second planar structure of a display substrate in an exemplary embodiment of the present disclosure. FIG. 4 is a schematic sectional view of the display substrate in FIG. 2 taken in an AA' direction, FIG. 5 is a schematic sectional view of the display substrate in FIG. 2 taken in a BB' direction, and FIG. 6 is a schematic sectional view of the display substrate in FIG. 2 taken in a CC' direction. FIG. 2 and FIG. 3 illustrate examples in which the shape of the anode is a notched rectangle including a first portion, a second portion and a third portion which are sequentially connected. FIG. 6 illustrates a structure of three sub-pixels of the display substrate.

In an exemplary embodiment, as shown in FIG. 2 to FIG. 6, in a plane perpendicular to the display substrate, the display substrate may include: a base 101, a drive circuit layer 102 arranged on a side of the base 101, an anode layer arranged on a side of the drive circuit layer 102 away from the base 101, and a pixel definition layer (PDL) arranged on a side of the anode layer away from the base.

In an exemplary embodiment, as shown in FIG. 2 to FIG. 6, the pixel definition layer (PDL) may include: a first definition layer PDL1 and a second definition layer PDL2 located on a side of the first definition layer PDL1 away from the base 101. The first definition layer PDL1 may include: a plurality of first definition structures 301 arranged in an array. The second definition layer PDL2 may include: a plurality of second definition structures 302 arranged at intervals in the first direction. A plurality of first definition structures 301 located between two adjacent second definition structures 302 are arranged at intervals in the second direction DR2, and an orthographic projection of the first definition structure 301 on the base 101 is separated from an orthographic projection of the second definition structure 302 on the base 101. In this way, lifting the second definition structure by the first definition structure can be avoided, thereby avoiding the occurrence of the problem of overlay in the pixel definition layer, avoiding the risk of reduction in the lyophobic property of the second definition layer PDL2, improving the quality of the pixel definition layer, and further improving the display effect.

In an exemplary embodiment, as shown in FIG. 2 to FIG. 6, a first boundary (also referred to as a left boundary) of the orthographic projection of the first definition structure 301 on the base 101 coincides with a second boundary of an orthographic projection of a second definition structure 302, located on a side of the first definition structure 301 in a direction opposite the first direction DR1, on the base 101, and a second boundary of the orthographic projection of the first definition structure 301 on the base coincides with a first boundary of an orthographic projection of another second definition structure 302, located on a side of the first definition structure 301 in the first direction, on the base 101. The first boundary and the second boundary both extend in the second direction DR2, and the second direction DR2 intersects the first direction DR1. For example, orthographic projections of the first definition structure 301 and the second definition structure 302 on the base 101 each include: a first boundary (also referred to as a left boundary) and a second boundary (also referred to as a right boundary) opposite each other in the first direction DR1. The first definition structure 301 is located between two adjacent second definition structures 302, one of the two adjacent second definition structures 302 is located on a side of the first definition structure 301 in a direction opposite the first direction DR1 (also referred to as being located on the left side of the first definition structure 301), and the other of the two adjacent second definition structures 302 is located on a side of the first definition structure 301 in the first direction DR1 (also referred to as being located on the right side of the first definition structure 301). In this way, the first definition structure is located between adjacent second definition structures and connected with them, which can prevent the first definition structure from lifting the second definition structure, thereby avoiding the occurrence of the problem of overlay in the pixel definition layer, avoiding the risk of reduction in the lyophobic property of the second definition layer PDL2, improving the quality of the pixel definition layer, and further improving the display effect. Here, "A coinciding with B" in the exemplary embodiment in the present disclosure does not require that A coincides with B completely, and there may be deviations within an allowable range due to process or tolerances.

In an exemplary embodiment, as shown in FIG. 2, the second definition structure 302 may be a strip-shaped structure of equal width extending in the second direction DR2. Alternatively, as shown in FIG. 3, the second definition structure 302 may be a strip-shaped structure of non-equal width extending in the second direction DR2.

In an exemplary embodiment, the plurality of second definition structures 302 may have a same shape.

In an exemplary embodiment, as shown in FIG. 2 and FIG. 3, the first definition structure 301 may be a block-shaped structure.

In an exemplary embodiment, the plurality of first definition structures 301 may have a same shape.

In an exemplary embodiment, the drive circuit layer 102 may include: a plurality of transistors M and a storage capacitor C which form a pixel drive circuit. For example, the pixel drive circuit may have a 3T1C, 4T1C, 5T1C, 5T2C, 6T1C, or 7T1C structure, which is not limited here in the embodiments of the present disclosure.

In an exemplary embodiment, as shown in FIG. 2 to FIG. 5, the anode layer may include: a plurality of anodes 201 arranged in an array. For example, the plurality of anodes 201 may have a same shape.

In an exemplary embodiment, as shown in FIG. 2 to FIG. 5, in a plane parallel to the display substrate, the shape of the anode may be a notched rectangle. For example, the notched rectangle may refer to a rectangle without four vertex angles, which is not limited here in the embodiments of the present disclosure.

In an exemplary embodiment, taking a case where the shape of the anode is a notched rectangle as an example, as shown in FIG. 2 and FIG. 6, in a direction opposite the second direction DR2, the anode 201 may include: a first portion 10, a second portion 20 and a third portion 30 which are connected sequentially, wherein the first portion 10 is configured to be connected, in a lapped way, with a drain electrode D of a corresponding drive transistor M through a via hole, the second portion 20 is configured to be connected with an organic light emitting layer, at least a portion of the organic light emitting layer is located in a pixel opening area, and a plurality of pixel opening areas are defined by a plurality of first definition structures 301 and a plurality of second definition structures 302.

In an exemplary embodiment, as shown in FIG. 2, the width of the first portion 10 of the anode 201 is smaller than the width of the second portion 20 of the anode 201, and the width of the third portion 30 of the anode 201 is smaller than the width of the second portion 20 of the anode 201. In this way, the anode appears as a strip-shaped structure with a wide middle and two narrow sides, which, on the one hand, can avoid overlay between the first pixel structure 301 and the second pixel structure 302, thereby avoiding the risk of reduction in the lyophobic property of the second definition structure 302, thus improving the quality of the pixel definition layer, and on the other hand, can ensure that the second pixel structure 302 can cover a lapping area of the anode 201 (i.e., the first portion 10 of the anode 201), thereby avoiding the risk of electric leakage. Here, the width refers to a dimensional feature in the first direction DR1.

In an exemplary embodiment, as shown in FIG. 2 and FIG. 4, the width wa1 of the first portion 10 of the anode 201 is smaller than the width wd of the first definition structure 301, so that the first definition structure 301 can completely cover the first portion 10 of the anode 201. Therefore, the risk of electric leakage can be avoided, and the display effect can be improved. In this way, lifting the second definition structure 302 by the anode can be avoided, which further improves the quality of the pixel definition layer. Here, the width refers to a dimensional feature in the first direction DR1.

In an exemplary embodiment, as shown in FIG. 2 and FIG. 4, the width wa1 of the first portion 10 of the anode 201 is smaller than the width wp of the first definition structure 301 (which is also the width of a spacing area between two adjacent second definition structures 302), and the width wa1 of the first portion 10 of the anode 201 is greater than the width wd of the drain electrode D of the drive transistor M. In this way, it can be ensured that the width of the first portion 10 of the anode 201 completely covers a lap hole and is normally and fully lapped with the drain electrode D of the drive transistor, so that the first definition structure 301 can completely cover the first portion 10 of the anode 201 and the drain electrode D. Therefore, the risk of electric leakage can be avoided, and the display effect can be improved. Here, the width refers to a dimensional feature in the first direction DR1.

In an exemplary embodiment, as shown in FIG. 2 and FIG. 4, the boundary of the orthographic projection of the first portion 10 of the anode 201 on the base 101 is located within a boundary range of an orthographic projection of a corresponding first definition structure 301 on the base 101. In this way, the first definition structure 301 can completely cover the first portion 10 of the anode 201 and the drain electrode D. Therefore, the risk of electric leakage can be avoided, and the display effect can be improved.

In an exemplary embodiment, as shown in FIG. 2 and FIG. 5, the width wa2 of the second portion 20 of the anode 201 is greater than the width wp of the spacing area between two adjacent second definition structures 302. Thus, in a display area (AA area), the second definition structure 302 may be connected with the second portion 20 of the anode 201 in a lapped way, thereby avoiding the risk of electric leakage and improving the display effect. For example, taking a case where the sectional shape of the second definition structure 302 is a trapezoid as an example, the width wp of the spacing area between two adjacent second definition structures 302 may refer to the width of the spacing area between the bottom surfaces (i.e., a surface on a side of the second definition structure 302 close to the base 101) of two adjacent second definition structures 302, i.e., the width of the spacing area between orthographic projections of two adjacent second definition structures 302 on the base 101.

In an exemplary embodiment, as shown in FIG. 2 and FIG. 5, there is an overlapping area between the orthographic projection of the second definition structure 302 on the base 101 and the orthographic projection of the second portion 20 of the anode 201 on the base 101. Thus, two adjacent second definition structures 302 overlay with the second portion 20 of the anode 201, so that the second definition structures 302 can be connected with the second portion 20 of the anode 201 in a lapped way, thereby avoiding the risk of electric leakage.

In an exemplary embodiment, as shown in FIG. 2 and FIG. 5, the width of the second portion 20 of the anode 201 is greater than the width of the pixel opening area 303. Here, the width refers to a dimensional feature in the first direction DR1.

In an exemplary embodiment, as shown in FIG. 2 and FIG. 5, a boundary of an orthographic projection of the pixel opening area 303 on the base 101 is located within a boundary range of an orthographic projection of a corresponding anode 201 on the base 101.

In an exemplary embodiment, as shown in FIG. 2, the width of the third portion 30 of the anode 201 is smaller than the width of the second portion 20 of the anode 201, and the width of the third portion 30 of the anode 201 is smaller than or equal to the width of the first definition structure 301. Thus, the first definition structure 301 can completely cover the third portion 30 of the anode 201, which can avoid the risk of electric leakage and improve the display effect.

In an exemplary embodiment, as shown in FIG. 2, the boundary of the orthographic projection of the third portion 30 of the anode 201 on the base 101 is located within a boundary range of an orthographic projection of a corresponding first definition structure 301 on the base 101.

In an exemplary embodiment, as shown in FIG. 2 and FIG. 3, in a plane parallel to the display substrate, the anode 201 may have a center line extending in the second direction DR2, and the shape of the anode 201 may be a pattern symmetric about the center line.

In an exemplary embodiment, as shown in FIG. 2 and FIG. 3, in a plane parallel to the display substrate, the anode 201 may have a center line extending in the second direction DR2, and at least one of the shapes of the first portion 10 of the anode 201, the second portion 20 of the anode 201, and the third portion 30 of the anode 201 may be a pattern symmetric about the center line.

In an exemplary embodiment, as shown in FIG. 2 and FIG. 3, in a plane parallel to the display substrate, sectional shapes of the first portion 10 of the anode 201, the second portion 20 of the anode 201, and the third portion 30 of the anode 201 may each be a rectangle. Here, "rectangle" in an exemplary embodiment of the present disclosure is not strictly defined, but may be an approximate rectangle, etc., there may be some small deformations caused by tolerance, and there may be chamfers, arc edges and deformations, etc. As such, the shape of the anode 201 may be a notched rectangle or an approximate notched rectangle.

In an exemplary embodiment, in two anodes adjacent in the second direction DR2, the boundary of the orthographic projection of the first portion 10 of one anode 201 on the base 101 and the boundary of the orthographic projection of the third portion 30 of the other anode 201 on the base 101 are located within a boundary range of an orthographic projection of a same first definition structure 301 on the base 101.

In an exemplary embodiment, as shown in FIG. 2 and FIG. 3, the second definition structure 302 may include: a first area corresponding to the first portion 10 of the anode 201, a second area corresponding to the second portion 20 of the anode 201, and a third area corresponding to the third portion 30 of the anode 201, the width of the first area and the width of the third area are both smaller than or equal to the width of the second area. As such, by setting the second definition structure 302 to be an equal-width strip-shaped structure or a locally thickened strip-like structure, it is ensured, in the display area (AA area), that the second definition structure 302 covers the anode 201 and the pixel opening area exposes the second portion 20 of the anode 201 which is connected with the organic light emitting layer, and in other areas, that the second definition structure 302 is only just in contact with the boundary of the first definition structure 301, thereby avoiding deterioration of the lyophobic property of the second definition structure 302.

In an exemplary embodiment, as shown in FIG. 2 and FIG. 3, a spacing between the second areas (i.e., areas in the second definition structures 302 corresponding to the second portions 20 of the anodes 201) of two adjacent second definition structures 302 is smaller than the width of the second portion 20 of the anode 201. In this way, the second definition structure 302 can cover a part of the anode 201 and the risk of electric leakage can be avoided.

In an exemplary embodiment, as shown in FIG. 2 and FIG. 3, in a plane parallel to the display substrate, the shape of the anode 201 may be a notched rectangle. Here, "notched rectangle" in an exemplary embodiment of the present disclosure is not strictly defined, but may be an approximate notched rectangle, there may be some small deformations caused by tolerance, and there may be chamfers, arc edges and deformations, etc.

In an exemplary embodiment, as shown in FIG. 4, a thickness h1 of the first definition structure 301 may be about 0.1 microns to 1 micron. For example, the thickness h1 of the first definition structure 301 may be about 0.1 microns, 0.2 microns, 0.3 microns, 0.4 microns, 0.5 microns, 0.6 microns, 0.7 microns, 0.8 microns, 0.9 microns, 1 micron or the like. The thickness refers to a dimensional feature in the third direction DR3, which is not limited here in the embodiments of the present disclosure.

In an exemplary embodiment, a thickness h2 of the second definition structure 302 may be about 1 micron to 10 microns. For example, the thickness h2 of the second definition structure 302 may be about 1 micron, 2 microns, 3 microns, 4 microns, 5 microns, 6 microns, 7 microns, 8 microns, 9 microns, 10 microns or the like. The thickness refers to a dimensional feature in the third direction DR3, which is not limited here in the embodiments of the present disclosure.

In an exemplary embodiment, as shown in FIG. 2 and FIG. 3, in a plane parallel to the display substrate, a sectional shape of the second definition structure 302 may be an elongated rectangle.

In an exemplary embodiment, as shown in FIG. 4 and FIG. 5, in a plane perpendicular to the base, the sectional shape of the second definition structure 302 may be a trapezoid. As such, a width of a bottom surface of the second definition structure 302 is greater than a width of a top surface of the second definition structure 302, so as to form a bottom-to-top expansion structure at both sides of the second definition structure 302 in a width direction. Such expansion structure can improve the volume fraction of the pixel opening area and increase an effective display area of sub-pixels. The bottom surface of the second definition structure 302 may refer to a surface of a side of the second definition structure 302 close to the base 101. Here, rectangle, trapezoid, etc. in an exemplary embodiment of the present disclosure are not strictly defined, but may be an approximate rectangle, trapezoid, etc., there may be some small deformations caused by tolerance, and there may be chamfers, arc edges and deformations, etc.

In an exemplary embodiment, taking a case where the display substrate is a 300 PPI printed device as an example, the width of the second definition structure 302 may be about 8 microns to 10 microns, which is not limited here in the embodiments of the present disclosure.

In an exemplary embodiment, in a plane parallel to the display substrate, the sectional shape of the first definition structure 301 may be any one of a rectangle, a rectangle with a chamfered corner, and a notched rectangle. Here, a rectangle, a rectangle with a chamfered corner, and a notched rectangle, etc. in an exemplary embodiment of the present disclosure are not strictly defined, but may be an approximate rectangle, rectangle with a chamfered corner, and notched rectangle, etc., there may be some small deformations caused by tolerance, and there may be chamfers, arc edges and deformations, etc.

In an exemplary embodiment, as shown in FIG. 2 and FIG. 3, a material of the first definition structure 301 may be a lyophilic material, thereby, which can ensure that the printing ink dripped into the pixel opening area is completely and fully spread, so that the printing ink forms a uniform film during drying. The lyophilic material may refer to a material attractive to a solution in which an organic electroluminescent material is dissolved. For example, the material of the first definition structure 301 may be a lyophilic material such as polyisoprene, polystyrene or epoxy resin. For example, a contact angle between the material of the first definition structure 301 and the printing ink is smaller than 5°, so that the printing ink can flow normally in the first definition structure 301 without agglomeration, which is not limited here in the embodiments of the present disclosure.

In an exemplary embodiment, as shown in FIG. 2 and FIG. 3, a material of the second definition structure 302 may be a lyophobic material, thereby which can restrict the printing ink to drip into a designated pixel opening area, effectively control the creep-up of the printing ink on the pixel definition layer, and ensure that the printing ink will not overflow. The lyophobic material may refer to a material having repellency to ink in which an organic electroluminescent material is dissolved. For example, the material of the second definition structure 302 may be a lyophobic material such as fluorinated polymethyl methacrylate or fluorinated polyimide. For example, a contact angle between the material of the second definition structure 302 and the printing ink is generally greater than 45°, so that the printing ink can agglomerate in the second definition structure 302, which is not limited here in the embodiments of the present disclosure.

In an exemplary embodiment, as shown in FIG. 6, in a plane perpendicular to the display substrate, the display substrate may further include: an organic light emitting layer arranged on a side of the anode 201 away from the base 101, a cathode 207 arranged on a side of the organic light emitting layer away from the base 101, and an encapsulation structure layer 104 arranged on a side of the cathode 207 away from the base 101. In some possible implementations, the display substrate may further include other film layers, such as a touch structure layer, which is not limited here in the embodiments of the present disclosure.

In an exemplary embodiment, the anode 201 is connected with a drain electrode D of a drive transistor M through a via hole (also referred to as a lap hole), the organic light emitting layer 103 is connected with the anode 201, the cathode 207 is connected with the organic light emitting layer 103, and the organic light emitting layer 103 is driven by the anode 201 and the cathode 207 to emit light of a corresponding color. For example, the cathodes 207 of all sub-pixels may be connected together to form a common layer. For example, the anodes 201 of adjacent sub-pixels may be isolated.

In an exemplary embodiment, the anode 201 may be made of a metal material or a transparent conductive material. The metal material may include any one or more of silver (Ag), copper (Cu), aluminum (Al), titanium (TI), and molybdenum (Mo), or an alloy material of the above metals. The transparent conductive material may include indium tin oxide (ITO) or indium zinc oxide (IZO). For example, the anode 201 may be a single-layer structure or a multi-layer structure, for example, the single-layer structure may include indium tin oxide (ITO) or indium zinc oxide (IZO), and the multi-layer structure may include: Ag/ITO, Mo/ITO, or (Al and its alloys)/ITO, which is not limited here in the embodiments of the present disclosure.

In an exemplary embodiment, the thickness of the anode 201 may be about 0.01 microns to 1 micron, which is not limited here in the embodiments of the present disclosure.

In an exemplary embodiment, the cathode 207 may be made of any one or more of magnesium (Mg), silver (Ag), aluminum (Al), copper (Cu), and lithium (Li), or an alloy made of any one or more of the above metals.

In an exemplary embodiment, the organic light emitting layer 103 may include an emitting layer (EML), and any one or more of following layers: a hole injection layer (HIL), a hole transport layer (HTL), an electron block layer (EBL), a hole block layer (HBL), an electron transport layer (ETL), and an electron injection layer (EIL).

In an exemplary embodiment, at least part of the film layers of the organic light emitting layer 103 may be formed using an inkjet printing process. For example, as shown in FIG. 6, taking a case where the organic light emitting layer 103 may include a hole injection layer (HIL) 202, a hole transport layer (HTL) 203, an emitting layer (EML) 204, an electron transport layer (ETL) 205 and an electron injection layer (EIL) 206 that are stacked, as an example, the hole injection layer (HIL) 202, the hole transport layer (HTL) 203, and the emitting layer (EML) 204 may be formed by an inkjet printing process.

In an exemplary embodiment, as shown in FIG. 6, one or more of the electron transport layer 205 and the electron injection layer 206 of all sub-pixels may be connected together to form a common layer.

In an exemplary embodiment, as shown in FIG. 6, the emitting layers of adjacent sub-pixels may be isolated.

In an exemplary embodiment, the encapsulation structure layer 104 may include: a first encapsulation layer, a second encapsulation layer and a third encapsulation layer that are stacked. For example, the first encapsulation layer and the third encapsulation layer may be made of an inorganic material, the second encapsulation layer may be made of an organic material, and the second encapsulation layer is arranged between the first encapsulation layer and the third encapsulation layer, so that it can be ensured that external water vapor cannot enter the emitting structure layer. FIG. 6 illustrates a structure of three sub-pixels of the display substrate. For example, the first encapsulation layer and the third encapsulation layer may be made of any one or more of silicon oxide (SiOx), silicon nitride (SiNx), and silicon oxynitride (SiON), may be a single layer, a multi-layer, or a composite layer, may adopt Chemical Vapor Deposition (CVD), or Atomic Layer Deposition (ALD), etc., and can ensure that external water and oxygen cannot enter the emitting structure layer. The second encapsulation layer may be made of an organic material, such as a resin, and may play a role of covering various film layers of the display area, so as to improve structural stability and planarization. In this way, the first encapsulation layer, the second encapsulation layer and the third encapsulation layer that are stacked form the encapsulation structure layer, and the formed laminated structure of an inorganic material/an organic material/an inorganic material may ensure integrity of encapsulation and effectively isolate external water and oxygen.

In an exemplary embodiment, the base 101 may be a flexible base, or may be a rigid base. For example, the rigid base may include, but not limited to, one or more of glass and quartz, and the flexible base may be made of, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. For example, the flexible base may include a first flexible material layer, a first inorganic material layer, a semiconductor layer, a second flexible material layer and a second inorganic material layer which are stacked on a glass carrier plate. Materials of the first flexible material layer and second flexible material layer may be polyimide (PI), polyethylene terephthalate (PET), or a surface-treated polymer soft film. Materials of the first inorganic material layer and the second inorganic material layer may be silicon nitride (SiNx), silicon oxide (SiOx), or the like, so as to improve water-oxygen resistance capability of the base. The first inorganic material layer and the second inorganic material layer are also referred to as barrier layers. A material of the semiconductor layer may be amorphous silicon (a-si).

In an exemplary embodiment, the drive circuit layer 102 of each sub-pixel may include a plurality of transistors and a storage capacitor forming a pixel drive circuit. FIG. 6 illustrates an example in which there is one drive transistor M and one storage capacitor C.

Figure 7:
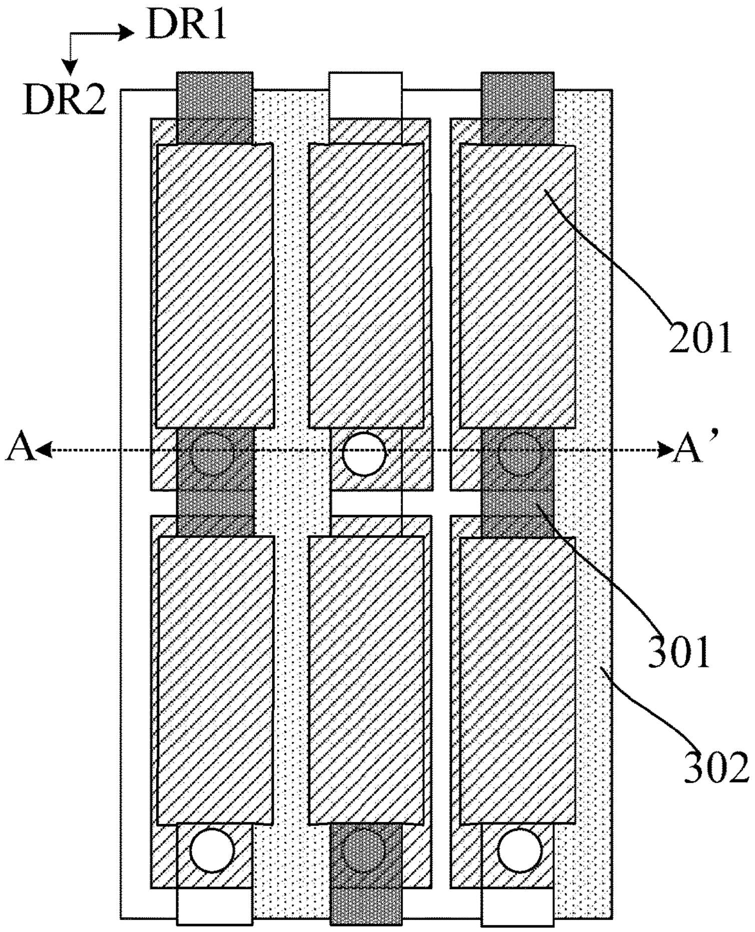
FIG. 7 is a schematic diagram of a third planar structure of a display substrate in an exemplary embodiment of the present disclosure.
Figure 8:
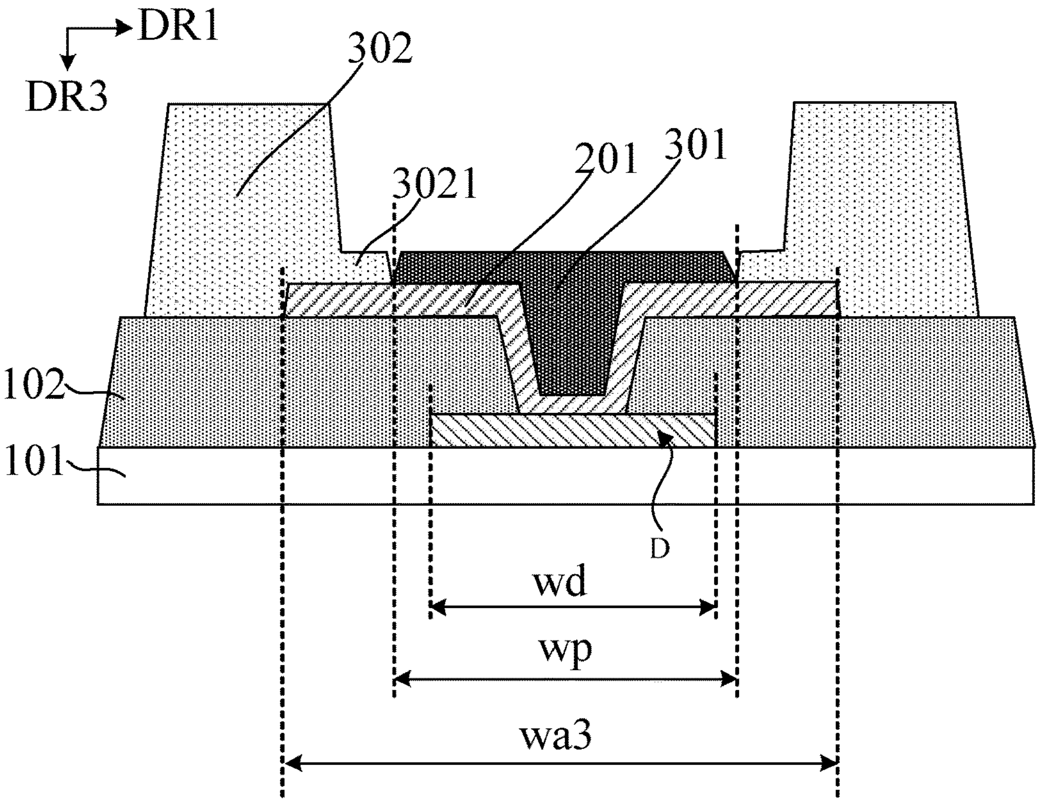
FIG. 8 is a schematic sectional view of the display substrate in FIG. 7 taken in an AA' direction.

FIG. 7 is a schematic diagram of a third planar structure of a display substrate in an exemplary embodiment of the present disclosure, and FIG. 8 is a schematic sectional view of the display substrate in FIG. 7 taken in an AA' direction. FIG. 7 illustrates an example in which the shape of the anode is a rectangle.

In an exemplary embodiment, as shown in FIG. 7 and FIG. 8, in a plane perpendicular to the display substrate, the display substrate may include: a base 101, a drive circuit layer 102 arranged on a side of the base 101, an anode layer arranged on a side of the drive circuit layer 102 away from the base 101, and a pixel definition layer (PDL) arranged on a side of the anode layer away from the base. The pixel definition layer (PDL) may include: a first definition layer PDL1, and a second definition layer PDL2 located on a side of the first definition layer PDL1 away from the base 101. The first definition layer PDL1 may include: a plurality of first definition structures 301 arranged in an array. The second definition layer PDL2 may include: a plurality of second definition structures 302 arranged at intervals in the first direction DR1. A plurality of first definition structures 301 located between two adjacent second definition structures 302 are arranged at intervals in the second direction DR2, and an orthographic projection of the first definition structure 301 on the base 101 is separated from an orthographic projection of the second definition structure 302 on the base 101. The second definition structure 302 may include: a plurality of first definition portions 40 and a plurality of second definition portions 50 arranged alternately. The second definition layer PDL2 may further include: a convex structure 60 arranged on an inner wall of a side of the second definition portion 50 of the second definition structure 302 close to the first definition structure 301, the position where the convex structure 60 is arranged corresponding to the position where the first definition structure 301 is arranged, and the convex structure 60 is in contact with the first definition structure 301. Thus, lifting the second definition structure 302 by the first definition structure 301 can be avoided, thereby avoiding the occurrence of the problem of overlay in the pixel definition layer, avoiding the risk of reduction in the lyophobic property of the second definition layer PDL2, improving the quality of the pixel definition layer, and further improving the display effect.

In an exemplary embodiment, as shown in FIG. 7 and FIG. 8, a first boundary (also referred to as a left boundary) of an orthographic projection of the first definition structure 301 on the base 101 coincides with a second boundary of an orthographic projection of a convex structure 60 located on a side of the first definition structure 301 in a direction opposite the first direction DR1 on the base 101, and a second boundary of the orthographic projection of the first definition structure 301 on the base coincides with a first boundary of an orthographic projection of another convex structure 60 located on a side of the first definition structure 301 in the first direction on the base 101, the first boundary and the second boundary both extend in the second direction DR2, and the second direction DR2 intersects the first direction DR1. For example, orthographic projections of the first definition structure 301 and the convex structure 60 on the base 101 each include: a first boundary (also referred to as a left boundary) and a second boundary (also referred to as a right boundary) opposite each other in the first direction DR1. A plurality of first definition structures 301 are located between two adjacent convex structures 60 and are arranged at intervals in the second direction DR2, one of two adjacent convex structures 60 is located on a side of the plurality of first definition structures 301 in a direction opposite the first direction DR1 (also referred to as being located on the left side of the first definition structure 301), and the other of the two adjacent convex structures 60 is located on a side of the plurality of first definition structures 301 in the first direction DR1 (also referred to as being located on the right side of the first definition structure 301). In this way, a plurality of first definition structures 301 located between two adjacent second definition structures 302 are separated from the second definition structure 302, which can prevent the first definition structure from lifting the second definition structure 302, thereby avoiding the occurrence of the problem of overlay in the pixel definition layer, avoiding the risk of reduction in the lyophobic property of the second definition layer PDL2, improving the quality of the pixel definition layer, and further improving the display effect.

In an exemplary embodiment, as shown in FIG. 7 and FIG. 8, in the first direction DR1, the widths of the first definition portion 40 and the second definition portion 50 in the second definition structure 302 may be equal.

In an exemplary embodiment, the plurality of second definition structures 302 may have a same shape.

In an exemplary embodiment, as shown in FIG. 7 and FIG. 8, a plurality of convex structures 60 may have a same shape.

In an exemplary embodiment, as shown in FIG. 7 and FIG. 8, the second definition portion 50 of the second definition structure 302 and the convex structure 60 may be connected to each other to form an integral structure. Here, an "integral structure" in an embodiment of the present disclosure may refer to a structure formed by two (or more) structures which are formed by a same deposition process and are patterned by a same patterning process so as to connect to each other, and their materials may be the same or different.

In an exemplary embodiment, materials of the second definition structure 302 and the convex structure 60 may be the same. For example, the material of the convex structure 60 may be a lyophobic material, so that it can restrict the printing ink to drip into a designated pixel opening area, effectively control the creep-up of the printing ink on the pixel definition layer, and ensure that the printing ink will not overflow. The lyophobic material may refer to a material having repellency to ink in which an organic electroluminescent material is dissolved. For example, the material of the convex structure 60 may be a lyophobic material such as fluorinated polymethyl methacrylate or fluorinated polyimide. For example, a contact angle between the material of the convex structure 60 and the printing ink is generally greater than 45°, so that the printing ink can agglomerate in the convex structure 60, which is not limited here in the embodiments of the present disclosure.

In an exemplary embodiment, as shown in FIG. 7 and FIG. 8, in the first direction DR1, the width wp of the first definition structure 301 located between two adjacent convex structures 60 and the width of the spacing area between two adjacent convex structures 60 may be equal. For example, the width of the spacing area between two adjacent convex structures 60 may refer to the width of the spacing area between bottom surfaces (i.e., surfaces of sides of the convex structures 60 close to the base 101) of two adjacent convex structures 60, i.e., the width of the spacing area between orthographic projections of two adjacent convex structures 60 on the base 101.

In an exemplary embodiment, as shown in FIG. 7 and FIG. 8, in the first direction DR1 the width wp of the first definition structure 301 is greater than the width wd of a drain electrode D of a drive transistor M. In this way, the first definition structure 301 can completely cover a lapping portion in which the anode 201 is connected with the drain electrode D in a lapped way and the drain electrode D. Therefore, the risk of electric leakage can be avoided, and the display effect can be improved.

In an exemplary embodiment, as shown in FIG. 7 and FIG. 8, the anode 201 may have a shape of an elongated rectangle.

In an exemplary embodiment, as shown in FIG. 7 and FIG. 8, in the direction opposite the second direction DR2, the anode 201 may include: a first portion 10, a second portion 20 and a third portion 30 which are sequentially connected. The first portion 10 is configured to be connected, in a lapped way, with a drain electrode D of a corresponding drive transistor M through a via hole, the second portion 20 is configured to be connected with an organic light emitting layer, at least a portion of the organic light emitting layer is located in a pixel opening area, and a plurality of pixel opening areas are defined by a plurality of first definition structures 301 and a plurality of second definition structures 302. For example, the width of the first portion 10 of the anode 201, the width of the second portion 20 of the anode 201 and the width of the third portion 30 of the anode 201 may be equal. Here, the width refers to a dimensional feature in the first direction DR1.

In an exemplary embodiment, as shown in FIG. 7 and FIG. 8, a width wa3 of the anode 201 is greater than the width wp of the first definition structure 301, and the width wa3 of the anode 201 is greater than the width of the spacing area between adjacent second definition structures 302 (which may include: a width of a spacing area between the first definition portions 40 of adjacent second definition structures 302, a width of a spacing area between the second definition portions 50 of adjacent second definition structures 302, and a width of a spacing area between the convex structures 60 provided on the second definition portions 50 of adjacent second definition structures 302). In this way, the second definition structure 302 can be connected with the anode 201 in a lapped way. Therefore, the risk of electric leakage can be avoided, and the display effect can be improved. Here, the width refers to a dimensional feature in the first direction DR1.

In an exemplary embodiment, as shown in FIG. 7 and FIG. 8, there is an overlapping area between the orthographic projection of the second definition structure 302 on the base 101 and the orthographic projection of the anode 201 on the base 101. In this way, the second definition structure 302 can be connected with the anode 201 in a lapped way, so that the risk of electric leakage can be avoided.

An embodiment of the present disclosure further provides a display apparatus. The display apparatus may include: the display substrate in one or more of the above embodiments.

In an exemplary embodiment, the display apparatus may include, but not limited to, an OLED display apparatus, or a Quantum-dot Light Emitting Diode (QLED) display apparatus, which is not limited here in the embodiments of the present disclosure.

Figure 9:
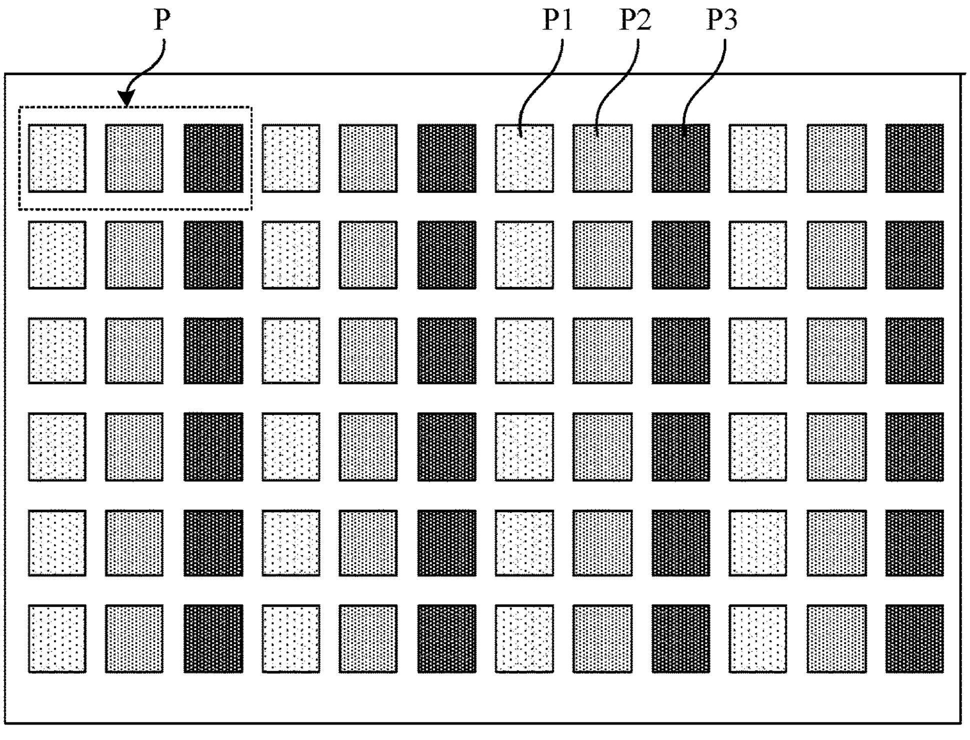
FIG. 9 is a schematic diagram of a planar structure of a display apparatus in an exemplary embodiment of the present disclosure.

FIG. 9 is a schematic diagram of a planar structure of a display apparatus in an exemplary embodiment of the present disclosure. As shown in FIG. 9, the display apparatus may include a plurality of pixel units P arranged in a matrix, wherein at least one of the plurality of pixel units P includes:

a first sub-pixel P1 that emits first-color light, a second sub-pixel P2 that emits second-color light, and a third sub-pixel P3 that emits third-color light. The three sub-pixels may each include a thin film transistor, a pixel electrode and a common electrode. For example, the first sub-pixel P1 may be a red (R) sub-pixel emitting red light, the second sub-pixel P2 may be a green (G) sub-pixel emitting green light, and the third sub-pixel P3 may be a blue (B) sub-pixel emitting blue light. For example, a pixel unit may include four sub-pixels, which is not limited here in the embodiments of the present disclosure.

In an exemplary embodiment, the plurality of sub-pixels in the pixel unit may be arranged in a manner, such as standing side by side horizontally, standing side by side vertically, an X shape, a cross shape, a shape like a Chinese character "品", or the like. For example, taking a pixel unit including three sub-pixels as an example, the three sub-pixels may be arranged in a manner, such as standing side by side horizontally, standing side by side vertically, a shape like a Chinese character "品", or the like. For example, taking a pixel unit including four sub-pixels as an example, the four sub-pixels may be arranged in a manner, such as standing side by side horizontally, standing side by side vertically, a square shape, or the like. The embodiments of the present disclosure are not limited thereto.

In an exemplary embodiment, a shape of a sub-pixel in the pixel unit may be any one or more of a triangle, a square, a rectangle, a rhombus, a trapezoid, a parallelogram, a pentagon, a hexagon, or another polygon, which is not limited here in the embodiments of the present disclosure.

In an exemplary embodiment, the display apparatus may include, but not limited to, any product or component having a display function such as a mobile phone, a tablet computer, a television, a display, a notebook computer, a digital photo bezel, or a navigator, which is not limited here in the embodiments of the present disclosure.

The above descriptions of embodiments of the display apparatus are similar to the above descriptions of the embodiments of the display substrate, and the embodiments of the display apparatus have similar beneficial effects as the embodiments of the display substrate. Technical details undisclosed in the embodiments of the display apparatus of the present disclosure may be understood by those skilled in the art with reference to the descriptions in the embodiments of the display substrate of the present disclosure, which will not be repeated here.

Although the implementations of the present disclosure are disclosed above, the above contents are only implementations for easily understanding the present disclosure and not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display substrate, comprising: a base and a pixel definition layer arranged on a side of the base, wherein the pixel definition layer comprises: a first definition layer, and a second definition layer, the first definition layer and the second definition layer are located on a same side of the base, at least one part of a surface of the second definition layer away from the base is higher than a surface of the first definition layer away from the base, the first definition layer comprises: a plurality of first definition structures arranged in an array, the second definition layer comprises: a plurality of second definition structures arranged at intervals in a first direction, a plurality of first definition structures located between two adjacent second definition structures are arranged at intervals in a second direction, and an orthographic projection of a first definition structure on the base is separated from an orthographic projection of a second definition structure on the base, the second direction intersects the first direction;

the display substrate further comprising:

a drive circuit layer arranged on a side of the base close to the pixel definition layer, and an anode layer arranged on a side of the drive circuit layer close to the pixel definition layer, wherein the drive circuit layer comprises: a plurality of drive transistors, the anode layer comprises: a plurality of anodes arranged in an array, an anode comprises: a first portion configured to be connected, in a lapped way, with a drain electrode of a corresponding drive transistor through a via hole, a width of the first portion is smaller than a width of the first definition structure, the width refers to a dimensional feature in the first direction; and an organic light emitting layer and a plurality of pixel opening areas, wherein the plurality of pixel opening areas are defined by the plurality of first definition structures and the plurality of second definition structures, at least a portion of the organic light emitting layer is located in a pixel opening area, the anode further comprises: a second portion located on a side of the first portion in a direction opposite the second direction, the second portion is configured to be connected with the organic light emitting layer, a width of the second portion is greater than the width of the first portion, and there is an overlapping area between an orthographic projection of the second portion on the base and an orthographic projection of the second definition structure on the base.

2. The display substrate according to claim 1, wherein the anode further comprises: a third portion located on a side of the second portion in a direction opposite the second direction, a width of the third portion is smaller than the width of the second portion, and the width of the third portion is smaller than or equal to the width of the first definition structure.

3. The display substrate according to claim 2, wherein in a plane parallel to the display substrate, the anode has a center line extending in the second direction, and at least one of shapes of the first portion, the second portion and the third portion is a pattern symmetric about the center line.

4. A display apparatus, comprising: the display substrate according to claim 3.

5. The display substrate according to claim 2, wherein in a plane parallel to the display substrate, a sectional shape of each of the first portion, the second portion and the third portion is a rectangle.

6. A display apparatus, comprising: the display substrate according to claim 5.

7. The display substrate according to claim 2, wherein in two anodes adjacent in the second direction, a boundary of an orthographic projection of a first portion of one anode on the base and a boundary of an orthographic projection of a third portion of the other anode on the base are within a boundary range of an orthographic projection of a same first definition structure on the base.

8. The display substrate according to claim 2, wherein the second definition structure comprises: a first area corresponding to the first portion, a second area corresponding to the second portion, and a third area corresponding to the third portion, a width of the first area and a width of the third area are both smaller than or equal to a width of the second area.

9. The display substrate according to claim 8, wherein a spacing between second areas of two adjacent second definition structures is smaller than the width of the second portion.

10. A display apparatus, comprising: the display substrate according to claim 2.

11. The display substrate according to claim 1, wherein in a plane parallel to the display substrate, a shape of the anode is a notched rectangle.

12. The display substrate according to claim 1, wherein a material of the first definition structure is a lyophilic material, and a material of the second definition structure is a lyophobic material.

13. The display substrate according to claim 1, wherein a thickness of the first definition structure is 0.1 microns to 1 micron, and a thickness of the second definition structure is 1 micron to 10 microns.

14. The display substrate according to claim 1, wherein in a plane parallel to the display substrate, a sectional shape of the second definition structure is an elongated rectangle, or in a plane perpendicular to the base, a sectional shape of the second definition structure is a trapezoid.

15. The display substrate according to claim 1, wherein in a plane parallel to the display substrate, a sectional shape of the first definition structure is any one of a rectangle, a rectangle with a chamfered corner, and a notched rectangle.

16. A display apparatus, comprising: the display substrate according to claim 1.

* * * * *